UHF TELEVISION TUNERS

Filed July 12, 1962 2 Sheets-Sheet 1

INVENTOR.
ROBERT C. A. ELAND
BY
OSTROLENK, FABER, GERB & SOFFEN
ATTORNEYS

March 22, 1966 R. C. A. ELAND 3,242,432

UHF TELEVISION TUNERS

Filed July 12, 1962 2 Sheets-Sheet 2

INVENTOR.
ROBERT C.A. ELAND
BY
OSTROLENK, FABER, GERB & SOFFEN
ATTORNEYS

United States Patent Office 3,242,432

Patented Mar. 22, 1966

3,242,432

UHF TELEVISION TUNERS

Robert C. A. Eland, Pasadena, Calif., assignor to Standard Kollsman Industries Inc., Melrose Park, Ill., a corporation of Illinois Filed July 12, 1962, Ser. No. 209,333
6 Claims. (Cl. 325—453)

This invention relates to novel tuners of broadcast UHF television programs, and more particularly relates to improvements in stabilizing the oscillator section thereof against drift due to temperature changes.

The UHF television frequency band is assigned in the 470 to 890 megacycle range. This wide extent of tuning is performed continuously by the type of tuners with which this invention is primarily concerned, without switching. A series of ganged variable condensers perform the mechanical changes for electrically tuning the circuit. A super heterodyne circuit configuration is used, employing a local oscillator. As the desired intermediate frequency (I.F.) output of such tuner is the same as the I.F. of the television receiver, it is practicably of the order of 40 mc.

The oscillator section therefor of the invention UHF continuous tuners accordingly is tunable in the UHF range, with a 420 mc. spread between channels 14 and 83, while held spaced from the tuned-in channels by the predetermined I.F. The accuracy of the received UHF signals is established by the transmitters, with no drift induced by the tuner in the preselection stages. However, to maintain stable tuning and reception, oscillator frequency drift must be inhibited.

High frequency type triode vacuum tubes are generally employed in this section of the tuner. The drift generally encountered heretofore, with temperature increase, was of a positive nature, namely the requisite frequency of the oscillator would decrease with ambient temperature rise. To offset such drift, fixed capacitors with negative temperature coefficients were used in the oscillator circuit. However, in view of the very wide band involved, the result was merely a tolerable compromise. Further, such capacitors added substantially to the tuner cost.

In accordance with the present invention the negative temperature characteristic is physically and mechanically incorporated in the variable tuning condenser, per se, of the oscillator circuit. The rotor blades thereof are longitudinally displaced "off-center" in relation to the stator blades. The rotor and stator blade sub assemblies are respectively mounted on supports or rods having substantially different coefficients of expansion. Temperature changes accordingly longitudinally displace or change the off-set relation of the rotor and stator blades with corresponding capacitive change.

The variable oscillator condenser of the invention UHF tuner is arranged to effect compensatory negative temperature coefficient action in the oscillator's operation. Thus, for all the settings to which the oscillator is tuned by its rotor, a slight capacitive change is superimposed upon ambient temperature change. The normally positive drift of the oscillator is arrested by a compensating negative capacitive change. The frequency decrease with temperature rise is compensated by the capacitive decrease effected in the variable tuning capacitor of the oscillator. This compensation directly through the variable condenser is effective over the whole UHF range. UHF tuners using the present invention are as stable temperature wise, as VHF tuners.

The above and further features, advantages and objects of the present invention will become more apparent from the following description of an exemplary embodiment thereof, illustrated in the drawings, in which.

Figure 1:
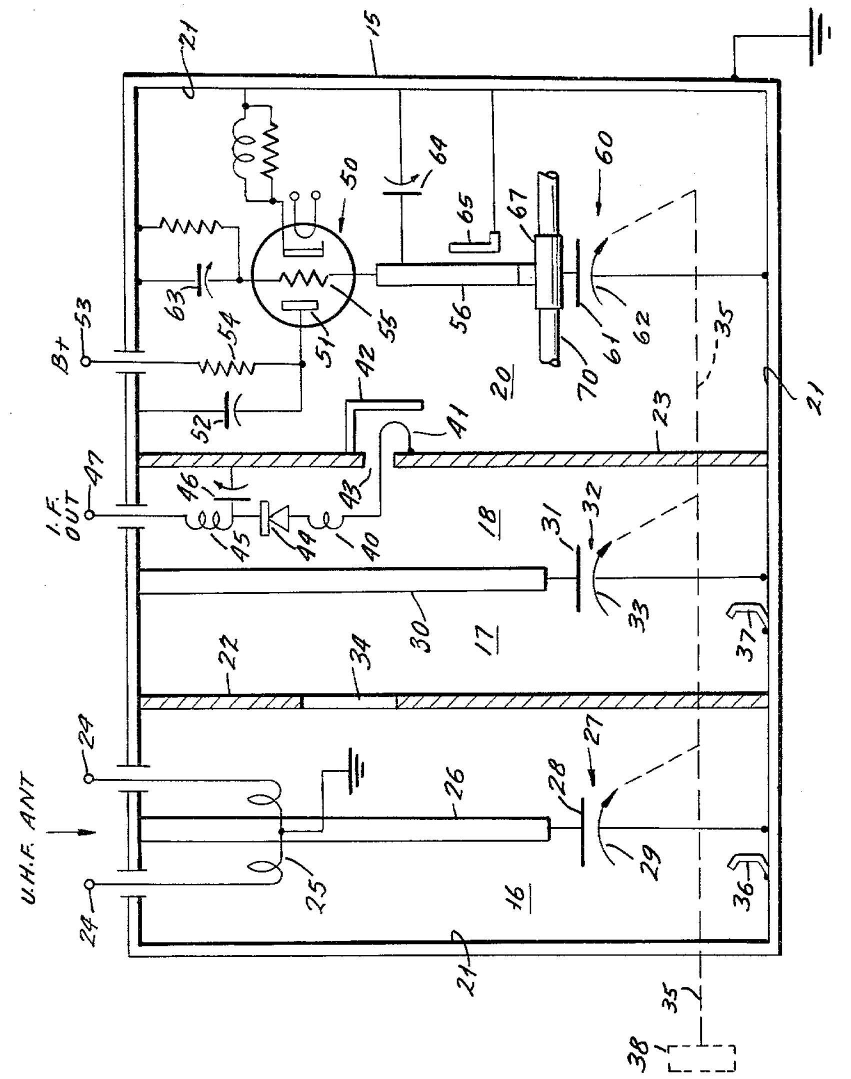
FIGURE 1 is a schematic diagram of the exemplary UHF tuner.

Referring to FIGURE 1, the UHF tuner 15 is a single conversion type providing continuous tuning over the entire UHF band for channels 14 through 83. The tuner 15 is of conventional circuitry and arrangement except for the method of and means for basically stabilizing frequency drift in its oscillator section 20, as stated herein above. The tuner 15 has a first and a second tuned preselector stage 16 and 17, and a mixer circuit 18. The double-tuned preselectors 16, 17, mixer 18 and oscillator stage 20 are arranged in compartments within chassis frame 21, by central shield plates 22 and 23.

The incoming UHF signal is tuned-in by the preselector stages 16, 17. A UHF antenna is connected to terminals 24, 24 to the primary winding 25 of a balanced antenna input. The primary 25 injects the incoming broadcast signal into the coaxial cavity, namely compartment 16. The center conductor or bar 26 of this cavity is the antenna secondary. Tuning of preselector stage 16 is accomplished by a variable condenser 27. The stator 28 of condenser 27 is connected to the interior end of bar 26; its rotor 29 to the chassis base.

The second preselector stage 17 is gang-tuned to the same frequency as stage 16 and the incoming UHF signal. A central conductor or bar 30 in the compartment cavity (17) connects to the stator 31 of variable condenser 32. The rotor 33 connects to the chassis frame. The middle compartment 17 is coupled to the first one (16) through a window opening 34 in plate 22. The rotors 29 and 33 are tuned in unison by a common tuning shaft 35. The variable condensers 27 and 32 are trimmed for tracking over the UHF range in a conventional way, as through slotted capacitor plates and tabs 36, 37.

The selected or tuned-in broadcast signal is picked-up by a coil 40 within compartment 17. Coil 40 is part of the mixer stage 18 in compartment 17. Coil 40 is also coupled to the oscillator stage 20 through a loop 41 projecting therein. 42 is an injection shield over loop 41 and aperture 43 in plate 23. The mixer crystal 44 connected to coil 40 feeds into tank 45, 46 pretuned to the I.F. frequency for the output 47; typically in the order of 40 megacycles.

The oscillator (20) is a modified Colpitts circuit. A high frequency type triode 50, as a 6AF4A tube, has its anode 51 signal grounded through capacitor 52. The B+ voltage for anode 51 is fed through terminal 53 and a decoupling resistor 54. The grid electrode 55 is in the tuning circuit comprising a rod 56 central of the compartment 20, connected to the stator plates 61 of variable condenser 60. The rotor 62 connects to chassis ground, and is rotated in unison with tuning shaft 35.

The oscillator stage (20) provides a suitable signal injection level for mixer stage 18 over the frequency range. The basic tracking adjustments for the oscillator, over the UHF tuning range, is through adjustments of slotted condenser (60) plates, trimmers 63, 64 and tab 65. An important stabilizing feature of the oscillator 20 is the negative temperature coefficient variable condenser 60. Condenser 60 basically compensates the oscillator 20 against thermal drift. In this way the UHF tuner 15 hereof is stable in operation over the whole 470 to 890 megacycle tuning range for television broadcasting, holding to its tracked settings as denoted by the tuning knob 38 on shaft 35.

Figure 2:
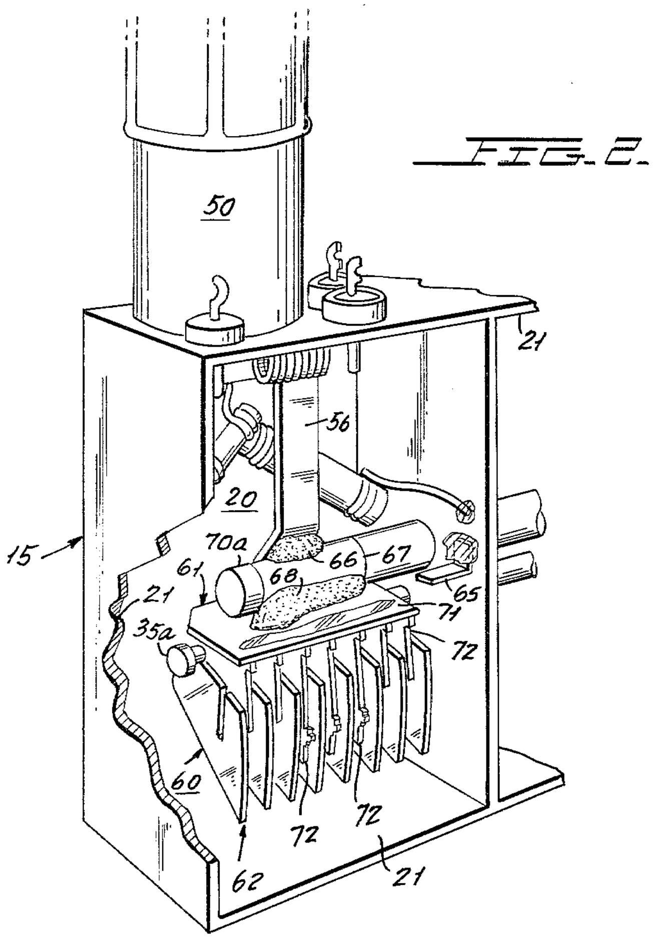
FIGURE 2 is a perspective illustration of the oscillator section of the UHF tuner hereof.

FIGURE 2 illustrates the physical incorporation of compensating variable condenser 60 in the oscillator stage 20. The central compartment conductor or bar 56 is soldered at 66 to a conductive band 67 on a ceramic support rod 70. Band 67 is preferably a firm layer of silver fired on rod 70. The rod 70 is of tough dielectric material as steatite, insulating the band 67 and connected circuitry from the grounded chassis and shield plate 23 in which the rod 70 is supported. Further, rod 70 is of material with a relatively low thermal expansion coefficient as compared to that of tuning rod 35 e.g. the order of $8.5 \times 10^{-6}$.

The stator sub assembly 61 is composed of a longitudinal metal base plate 71 soldered along 68 to silver band 67. The parallel stator plates 72, 72 are secured transversely to base plate 71 to form the stator subassembly 61. The metal used for plates 71 and 72 thereof is also of relatively low thermal expansion, as of cold rolled steel with a coefficient of the order of $12 \times 10^{-6}$. The rotor plates 73, 73 are suitably fastened to the tuning shaft 35. Plates 73, 73 are slotted and shaped for providing substantially linear tracking over the UHF tuning range of tuner 15.

Figure 3:
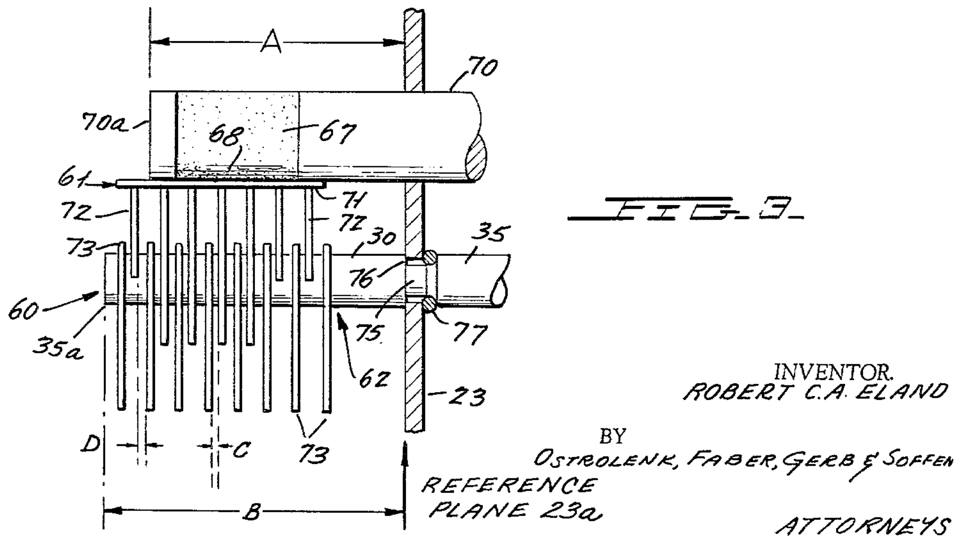
FIGURE 3 is an enlarged elevational view of the exemplary variable condenser used in the oscillator section.

The tuning shaft 35 is made of material with a relatively high thermal coefficient of expansion, as of brass or nickel silver with respective coefficients of $20 \times 10^{-6}$ or $16 \times 10^{-6}$. FIGURE 3 illustrates the exemplary tuning condenser 60 construction to provide the aforesaid negative temperature compensatory coefficient for the oscillator stage 20 frequency stability. Towards this end the ceramic rod 70 is predeterminedly located in plate 23 that supports it, as is tuning shaft 35. The stator assembly 61 is composed of plates 72, 72 at predetermined spacing along plate 71, and its base plate 71 located predeterminedly with respect to end 70*a* of rod 70.

Thus by locating rod end 70*a* at a preset distance A from reference plane 23*a* of plate 23, the whole stator assembly and its plates 72, 72 are positioned. Shaft 35 is undercut at 75 at aperture 76 in wall 23, and secured with ring 77. Similarly, the end 35*a* of tuning shaft 35 is located a preset distance B from reference plane 23*a*. The preset dimensions A and B are effected at the corresponding ambient temperature. The rotor plates 73, 73 when thus mounted will be predeterminedly off-set longitudinally with respect to the stator plates 72, 72 as shown in FIGURE 3.

At the mounting predetermined temperature, e.g. 20° C., the distance between the closer facing surfaces (FIG. 3) of plates 72 and 73 is denoted at C and the larger spacing by D. As the metal shaft 35 has a substantially higher thermal coefficient of expansion than ceramic rod 70, shaft 35 expands longitudinally to the left, from reference planes 23*a* with temperature rise more than does rod 70. Because of this, the smaller spacing (C) between stator and rotor plates 72 and 73 increases with temperature, and that corresponding to larger spacing (D) decreases.

The effective result of such relative rotor-stator plate shifts with temperature rise is that the capacitance obtained by the spacing corresponding to (C) will decrease; and that to (D) will increase. Spacing C is made considerably smaller than plate spacing D. Therefore the rate of capacity decrease due to the C dimension change is greater than that due to the D dimension. The net effect is a small capacity decrease of the condenser 60 capacity with temperature rise. The net capacity change is inversely proportional to temperature change, and is relatively small compared to the total condenser (60) capacity. Nevertheless, by suitably proportioning the dimensions A, B, C and D for a given condenser (60) and oscillator circuit (20), thermal drift is in effect eliminated as a practical problem in the UHF tuner 15 operation. The negative temperature coefficient of condenser

60 is found to be effective over the entire television UHF tuning range. The oscillator 60 remains stable and provides the preset tracked frequency injection to mixer stage 18 over all normally encountered temperature conditions for television reception.

Although this invention has been described in connection with a specific exemplary form, it is to be understood that modifications may be made therein that are encompassed by the invention as set forth in the accompanying claims.

I claim:

1. A UHF tuner for receiving television signals in the range of 470 to 890 megacycles comprising a preselection stage with a variable tuning condenser operable over said range, a mixer stage coupled to said preselection stage for producing signals corresponding to preselected television channels at a predetermined intermediate frequncy output and an oscillator stage including a circuit tunable over a frequency range in correspondance with the the preselection tuning and coupled with said mixer stage for heterodyning the received channels to said intermediate frequency, said tunable circuit incorporating a temperature compensating variable tuning condenser for effectively maintaining said oscillator stage frequency range against drift with ambient temperature change.

2. A UHF tuner for receiving television signals in the range of 470 to 890 megacycles comprising a first and second preselection stage each with a variable tuning condenser operable over said range, a mixer stage coupled to said second preselection stage for producing signals corresponding to preselected television channels at a predetermined intermediate frequency output and an oscillator stage with a positive frequency drift characteristic including a circuit tunable over a frequency range in correspondence with the preselection tuning and coupled with said mixer stage for heterodyning the received channels to said intermediate frequency, said tunable circuit incorporating a temperature compensating variable tuning condenser with a negative capacitive characteristic for effectively maintaining said oscillator stage frequency range against drift with ambient temperature change, said variable tuning condensers being ganged for unitary tuning operation whereby the said range of UHF television signals are received along predeterminedly tracked tuning positions.

3. A UHF television tuner as claimed in claim 1, in which said temperature compensating variable tuning condenser is composed of a frame, a stator assembly of plates spaced predeterminedly apart, a rod of relatively low thermal expansion characteristic, said stator plates longitudinally spaced along said rod and directly secured thereto for mounting said stator assembly with its plates at a preset location in the frame, a rotor assembly of plates spaced predeterminedly apart, a shaft of substantially higher thermal expansion characteristic than said rod, said rotor plates longitudinally spaced along said shaft and directly secured thereto, for mounting said rotor assembly with its plates rotatable between said stator plates and parallel thereto, said rotor plates being individually located longitudinally closer to the stator plates at their one side than to those on the other, whereby ambient temperature changes effect greater expansion of said mounting shaft than said mounting rod to provide a compensating net capacitive alteration in the oscillator variable condenser to maintain the requisite oscillator frequencies over the tuner reception range.

4. A UHF television tuner as claimed in claim 2, in which said temperature compensating variable tuning condenser is composed of a frame, a stator assembly of plates spaced predeterminedly apart, a dielectric rod, said stator plates longitudinally spaced along said rod and directly secured thereto for mounting said stator assembly with its plates at a preset location in the frame, a rotor assembly of plates spaced predeterminedly apart, a metallic shaft, said rotor plates longitudinally spaced along said shaft and directly secured thereto, for mounting said rotor assembly with its plates rotatable between said stator plates and parallel thereto, said rotor plates being individually located longitudinally off-set between their adjacent stator plates with the rotor plates closer to the stator plates at their one side than to those on the other and thereby establish greater capacitance with the closer stator plates than with the farther ones, whereby ambient temperature changes effect greater expansion of said mounting shaft than said mounting rod to provide a compensating net capacitive alteration in the oscillator variable condenser to maintain the requisite oscillator frequencies over the tuner reception range.

5. A UHF television tuner as claimed in claim 1, in which said temperature compensating variable tuning condenser is composed of a frame with a transverse reference mounting plane, a stator assembly of plates spaced predeterminedly apart, a ceramic rod of relatively low thermal expansion characteristic, said stator plates longitudinally spaced along said rod and directly secured thereto for mounting said stator assembly with its plates at a preset location with respect to said reference plane, a rotor assembly of plates spaced predeterminedly apart, a shaft of substantially higher thermal expansion characteristic than said rod, said rotor plates longitudinally spaced along said shaft and directly secured thereto, for mounting said rotor assembly with its plates rotatable between said stator plates and parallel thereto, said rotor plates being individually located longitudinally off-set between their adjacent stator plates with the rotor plates closer to the stator plates at their one side than to those on the other, whereby ambient temperature changes effect greater expansion of said mounting shaft than said mounting rod to provide a compensating net capacitive alteration in the oscillator variable condenser to maintain the requisite oscillator frequencies over the tuner reception range.

6. A UHF television tuner as claimed in claim 2, in which said temperature compensating variable tuning condenser is composed of a frame with a transverse reference mounting plane, a stator assembly of plates spaced predeterminedly apart, dielectric rod of relatively low thermal expansion characteristic, said stator plates longitudinally spaced along said rod and directly secured thereto for mounting said stator assembly with its plates at a preset location in the frame with respect to said reference plane, a rotor assembly of plates spaced predeterminedly apart, a shaft of substantially higher thermal expansion characteristic than said rod, said rotor plates longiutdinally spaced along said shaft and directly secured thereto, for mounting said rotor assembly with its plates rotatable between said stator plates and parallel thereto, said rotor plates being individually located longitudinally off-set between their adjacent stator plates with the rotor plates closer to the stator plates at their one side than to those on the other and thereby establish greater capacitance with the closer stator plates than with the farther ones, whereby ambient temperature changes effect greater expansion of said mounting shaft than said mounting rod to provide a compensating net capacitive alteration in the oscillator variable condenser to maintain the requisite oscillator frequencies over the tuner reception range.

References Cited by the Examiner

UNITED STATES PATENTS

| | | | |
|---|---|---|---|
| 2,015,732 | 10/1935 | Seely | 317—248 XR |
| 2,027,521 | 1/1936 | Drake | 331—176 |
| 2,123,050 | 7/1938 | Johnson | 334—6 XR |
| 2,798,945 | 7/1957 | Hinsdale | 325—445 XR |

OTHER REFERENCES

Terman: Radio Engineer's Handbook, McGraw-Hill Book Company, Inc., New York, 1943, pp 122–123.

ROBERT H. ROSE, *Primary Examiner.*

DAVID G. REDINBAUGH, *Examiner.*